United States Patent

[11] 3,613,021

[72] Inventor Christian Scheidt
Erlangen, Germany

[21] Appl. No. 797,582
[22] Filed Feb. 7, 1969
[45] Patented Oct. 12, 1971
[73] Assignee Siemens Aktiengesellschaft
Berlin, Germany
[32] Priority Feb. 20, 1968
[33] Switzerland
[31] 2477/68

[54] HALL-EFFECT AMPLIFYING DEVICE WITH TEMPERATURE COMPENSATED CHARACTERISTIC
7 Claims, 5 Drawing Figs.

[52] U.S. Cl. .......... 330/6, 330/1
[51] Int. Cl. .......... H03f 15/00
[50] Field of Search .......... 330/6; 307/278, 309

[56] References Cited

UNITED STATES PATENTS

| | | | |
|---|---|---|---|
| 3,189,838 | 6/1965 | Leger, Jr. | 330/6 |
| 3,443,234 | 5/1969 | Bizet | 330/6 |
| 3,317,835 | 5/1967 | Dietz et al. | 330/6 X |
| 3,405,870 | 10/1968 | DeForest | 330/6 X |

*Primary Examiner*—Nathan Kaufman
*Attorneys*—Curt M. Avery, Arthur E. Wilfond, Herbert L. Lerner and Daniel J. Tick

ABSTRACT: A Hall-effect amplifying device comprising a Hall generator and an electronic amplifier is provided with a feedback resistor circuit which connects the amplifier output directly with one of the two Hall-voltage electrodes of the Hall generator. The amplifier in this device is an electronic direct-current amplifier of high-ohmic input resistance and high no-load gain. The resistance of the feedback connection is two or more orders of magnitude higher than the internal resistance between the Hall-voltage electrodes of the Hall generator.

HALL-EFFECT AMPLIFYING DEVICE WITH TEMPERATURE COMPENSATED CHARACTERISTIC

Hall generators are increasingly used for measuring, controlling and regulating purposes, for example in conjunction with voltage amplifiers to serve as continuously operating signal transmitter, or as a flip-flop system for use as a proximity switch or limit sensor operating without the necessity of contact engagement. As a rule, the use of Hall generators requires giving attention to the considerable dependence of the utilized Hall voltage upon changes in temperature, which may affect the switching or total amplification of a signalling, measuring or sensing system of any of the types mentioned. Generally, it is feasible to compensate for changes in temperature by providing the input circuit of an amplifying device, connected to the Hall-voltage output electrodes of the Hall generator, with a temperature-responsive negative-feedback coupling. This, however, demands time-consuming dimensioning expedients adapted to each particular purpose or circuitry and is also based upon the prerequisite of having the Hall generator and the amplifier subjected to the same ambient temperature so that they must not be spacially separated from each other.

It is an object of my invention to minimize or obviate these requirements and thus attain the desired temperature compensation of the system characteristics in a considerably simpler manner.

To this end, and in accordance with the feature of my invention, I provide a Hall-voltage amplifying device for the purpose of compensating its operating characteristics with respect to changes in temperature, with an electronic, preferably solid-state, direct-current amplifier whose input is connected to the Hall-voltage output electrodes of the Hall generator, and I connect the output of this amplifier through a feedback resistor directly with one of the Hall-voltage electrodes of the Hall generator and thus also directly with one of the input leads or terminals of the same amplifier. The just-mentioned direct-current amplifier should have a high no-load gain, as will be more fully set forth hereinafter.

The feedback connection according to the invention takes advantage of the recognition that a change in temperature causes changes in the same sense and to approximately the same percentile extent in the path resistances of the semiconductor wafer or platelet which forms the Hall probe of the Hall generator, as well as relative to the voltage taken from the Hall electrodes of the probe. In a device according to the invention, therefore, the internal resistance of the Hall generator probe becomes included in the feedback network of the electronic amplifier; and it is by virtue of this fact that a virtually complete compensation of the temperature effect upon the operational characteristics is achieved in a particularly simple manner.

A further object of my invention, akin to the one described above, is to minimize the effect of the temperature-responsive feedback resistance.

According to another feature of my invention, therefore, it is preferable to give the resistance of the feedback resistor connection a value which is at least two decimal orders of magnitude higher than the internal resistance of the Hall generator, or rather of its semiconductor wafer or probe, this internal resistance being the one obtaining between the two Hall-voltage electrodes of the probe.

Still another object of the invention is to provide a Hall-effect amplifying device that is particularly well suitable for use as a magnetically responsive proximity switch and exhibits a bistable flip-flop characteristic. More specifically, it is an object of the invention to render such a Hall-effect device independent of the particular temperature obtaining at a given time but rather to respond at a given magnitude of the magnetic field acting upon the Hall generator, so that the Hall-effect bistable device will always trigger at substantially the same switching point.

To this end, and in accordance with a further feature of my invention, I connect the above-mentioned feedback resistor means with the one input pole or terminal of the amplifier at which the feedback is positive, and I give the resistance the dimension required to have the positive feedback constitute a supercritical coupling between amplifier output and input, thus securing the bistable flip-flop characteristic desired.

Another object of my invention is to afford selecting or determining in any desired manner the switching range of the Hall-effect amplifying device irrespective of changes in temperature.

For obtaining such temperature constancy of switching operation, and in accordance with still another feature of my invention, I connect a voltage divider between one of the current-supply terminals of the Hall generator and one of the Hall-voltage electrodes thereof, and I further connect a portion of this voltage divider in the input circuit of the electronic amplifier. Preferably, the portion of the voltage-divider resistance inserted into the amplifier input circuit is ohmically so dimensioned that it is at least one order of magnitude higher than the internal resistance of the Hall generator that is series connected with the voltage-divider portion.

A further object of the invention is to devise a Hall-effect amplifier device which is particularly well suitable for use as a temperature-compensated continuously operable signal transmitter of substantially linear characteristic.

For attaining the latter object, and in accordance with another feature of my invention, the feedback-resistor connection is so attached to the amplifier input as to constitute a negative feedback.

The above-mentioned and more specific objects, advantages and features of the invention will be more fully understood from the following description taken in conjunction with the accompanying drawings, in which.

Figures 1, 5:
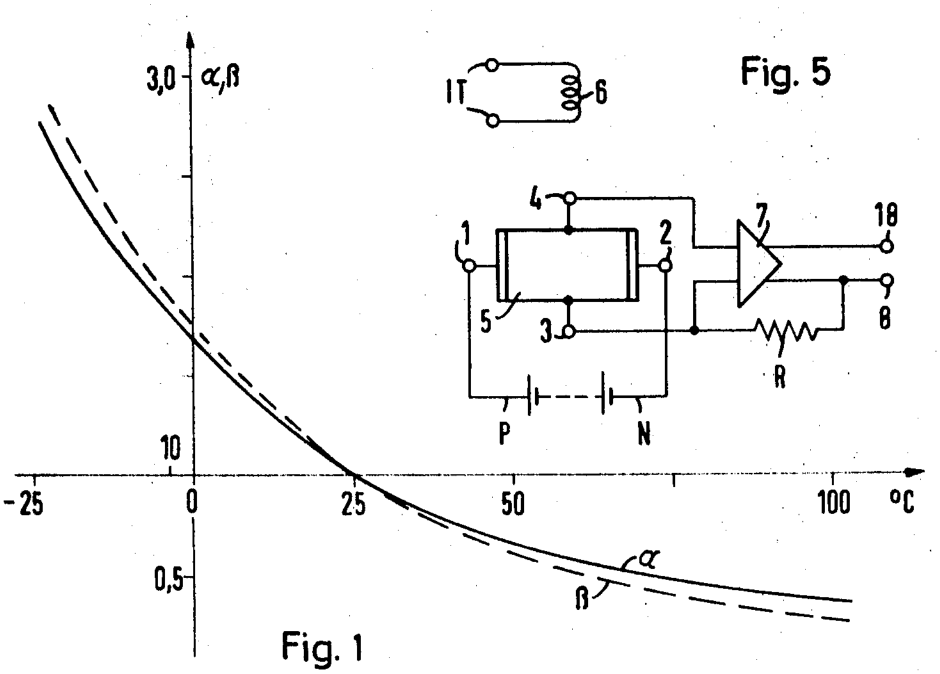
FIG. 1 is an explanatory graph relating to the temperature coefficients of a Hall plate.
FIG. 5 is a simplified and explanatory circuit diagram corresponding in substance with that shown more elaborately in FIG. 2.
Figure 2:
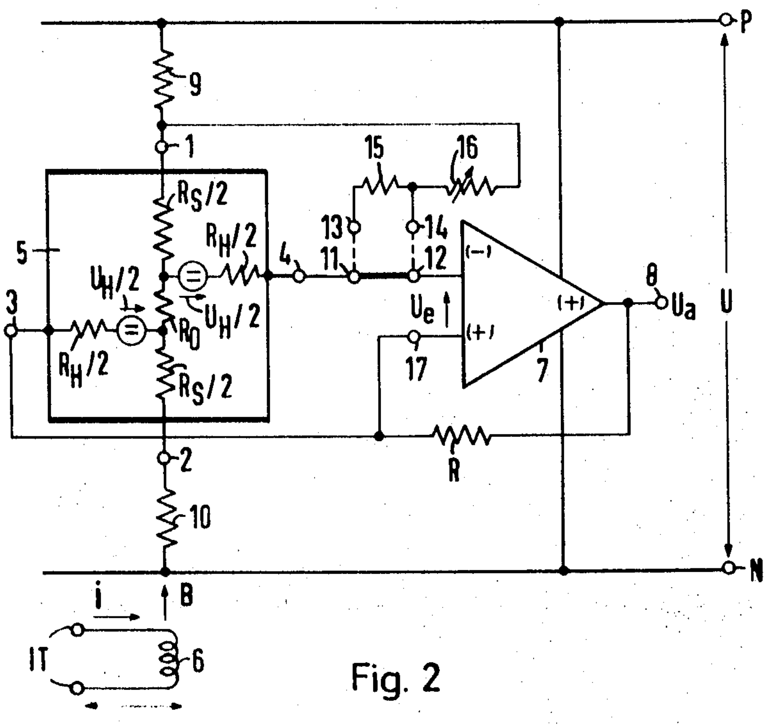
FIG. 2 shows by way of example a schematic circuit diagram of a Hall-voltage amplifying device according to the invention, the appertaining Hall generator being also represented by a substitute circuit diagram of its internal resistances.
Figure 4:
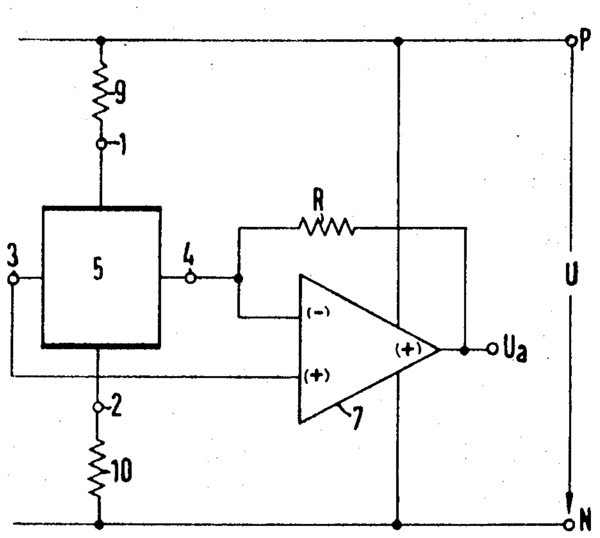
FIG. 4 is a schematic circuit diagram of another embodiment of the invention applicable as a steady-signal generator.

It will be helpful to first refer to the explanatory illustration in FIG. 5 in which the same reference numerals are applied as in FIGS. 2 and 4 for corresponding components respectively.

As shown in FIG. 5, a Hall-voltage generator comprises essentially a wafer or platelet 5 of semiconductor material, preferably of indium antimonide. The one shown has the conventionally preferred rectangular shape and is provided with respective current-supply contacts at its two short sides. These contacts are connected to respective terminals 1 and 2 which receive constant direct current from a suitable source, here schematically shown as in battery P–N. Two Hall electrodes are located midway between the two current-supply contacts on the respective long sides of the rectangular shape and are connected to respective electrode terminals 3 and 4. When no magnetic field acts upon the Hall plate 5, the two Hall electrodes and respective terminals 3 and 4 have the same voltage so that no voltage difference obtains between them. However, when a magnetic field is effective in a direction perpendicular to the plane of the Hall plate, or has a component in that direction, the two Hall-voltage electrodes assume respectively different potentials so that a voltage difference exists between the terminals 3 and 4. This constitutes the output voltage or Hall voltage of the generator and is proportional to the intensity of the magnetic field strength acting perpendicularly to the Hall plate. In the embodiment shown in FIG. 5 (or FIG. 2), the energizing coil 6 is energized from the input terminals IT of the device. The output voltage of the Hall generator is applied to the input of a DC amplifier 7 which furnishes an amplified output voltage between its output terminals 8 and 18. According to the invention, a feedback resistor R is connected between one of the output terminals 8 and one of the Hall-voltage terminals 3, being also in connection with one of the input leads of the amplifier 7. The connections effected by the feedback-resistor circuit are direct, i.e. ohmic or galvanic in character rather than being inductive or capacitive.

Turning now to FIG. 1, the illustrated graph represents a coordinate diagram which indicates temperature along the abscissa in °C. and the temperature coefficient along the ordinate. The curve denoted by $\alpha$ represents the temperature coefficients of the path resistances of a Hall plate consisting of indium antimonide, and the curve denoted by $\beta$ represents the temperature coefficients of the Hall voltage. The Hall plate, of course, may also consist of other semiconductor material, preferably III–V compounds or germanium, in which cases the two curves here of interest are different but similarly related to each other. The two curves $\alpha$ and $\beta$ shown in FIG. 1 exhibit virtually the same course over a large range of temperatures. Denoting by $R_H^+$ the value of the path resistance $R_H$ at the temperature of 25° C., and denoting by $U_H^+$ the value of the Hall voltage $U_H$ occurring at the same temperature of 25° C., the values of the coefficients $\alpha$ and $\beta$ at temperatures differing from 25° C. can be determined from the diagram of FIG. 1 as being represented by the following equations:

$$B_H=\alpha\cdot R_H^+ \text{ and } U_H=\beta\cdot U_H^+$$

The embodiment of the invention illustrated in FIG. 2 constitutes a switching device which is to issue at output terminal 8 a predetermined output signal $U_a$ when the magnetic flux B traversing the Hall plate 5 exceeds a given magnitude. The flux magnitude is attained by varying the excitation current *i* of a suitably arranged electromagnet whose coil is shown at 6. However, the critical flux value may also be attained by moving a permanent magnet or an electromagnet of constant excitation past the Hall plate 5. The magnet, of course, may be constituted by any other source of magnetic flux, such as by the earth magnetic field or the field of electric machinery.

More in detail, the device according to FIG. 2 comprises a differential amplifier 7 of known-type which is energized by direct voltage U between the positive and negative buses P and N. The output voltage $U_a$ at terminal 8 is related to a point of potential situated between the potentials of buses P and N. The output terminal 8 is connected with one of the two input terminals, namely the one denoted by 17, of the amplifier 7 through a feedback resistor R, the polarity or connection, being such as to provide for positive feedback. When the input voltage $U_e$ between the input terminals 12 and 17 of the difference amplifier 7 is zero, the output terminal 8 has the potential of the above-mentioned reference point ($U_a$=0). When the input voltage $U_e$ differs from zero and has the polarity indicated in FIG. 2 by an arrow, the potential of the output terminal 8 increases. With an opposite polarity of the input voltage $U_e$ the potential of the output terminal 8 decreases. The differential amplifier 7 has a high open-loop voltage gain and, for compact size, may be designed as an integrated circuit. Preferably the gain is in the $10^4$ order of magnitude and its input impedance is at least in the order of $10^6$ ohm.

Direct-current voltage amplifiers of this type as well as their internal circuitry are known. One of these amplifiers is for instance the $\mu$A 709 C High Performance Operational Amplifier manufactured by SGS-Fairchild. This highly sensitive amplifier consists of a linear planar integrated circuit whose input resistance is $10^7$ to $10^8$ ohms and whose overall gain is greater than 12,000.

The Hall-voltage output terminals 3 and 4 of the Hall-generator probe 5 are directly connected with the two input terminals 12 and 17 of the differential amplifier 7. The control current terminals 1 and 2 of the probe are connected to the respective direct-current buses P and N through symmetrizing resistors 9 and 10 of equal resistance magnitudes. The electrical substitute diagram of the Hall probe 5, shown within the rectangular confines of plate 5 in FIG. 2, may be looked upon as being composed of the two equal path resistances $R_S/2$ on the control-current side and two likewise equal Hall-side path resistances $R_H/2$. For completeness, a resistance $R_O$ is shown between the two path resistances $R_S/2$ to represent the influence of the so-called ohmic-null component of the Hall generator, this influence manifesting itself by the appearance of a voltage between the Hall electrodes 3 and 4 when the magnetic field B is equal to zero. Since this resistance $R_O$, with respect to its order of magnitude, is virtually negligible relative to the other path resistances, its influence is ignored in the considerations presented hereinafter.

It will be recognized that between the two Hall-voltage output terminals 3 and 4 the generated Hall voltage $U_H$ is connected in series with an internal resistance $R_H$, this voltage $U_H$ being impressed upon the input circuit of the differential amplifier 7. The resistances R and $R_H/2$ form a voltage divider which positively couples a portion of the output voltage $U_a$ into the input circuit of the amplifier 7, thus boosting the controlling voltage. By correspondingly dimensioning the resistance of the feedback resistor R, this boosting portion of the output voltage is made larger than the originally slight amount of the input voltage that would suffice for maximum control of the amplifier 7 under no-load conditions. Such a supercritically and boostingly coupled amplifier assumes one of two possible limit states which correspond to full control in positive and negative directions respectively. An input voltage applied to the amplifier must first overcome the boosting portion of the output voltage before the amplifier can trip to its other limit state. Consequently, the amplifying device has a flip-flop switching characteristic which exhibits a hysteresis as shown, in principle, in FIG. 3. That is, in dependence upon the Hall voltage $U_H$, the output voltage $U_a$ of the amplifier assumes one of two defined values, and the triggering from one state to the other takes place always upon exceeding the corresponding limit of response at $-b$ or $+b$, as defined by the condition that $$b=\frac{R_H/2}{R_H/2+R}\cdot U_a$$

If $R$ is very large relative to $R_H$, this equation converts to $$b=R_H/2R\cdot U_a$$

It will be recognized that by employing a sufficiently high-feedback resistance R, any desired narrow trigger limits can be set. From the viewpoint of the present invention, however, it is more significant that the effect of temperature variation changes the trigger limits by virtually the same factor as the Hall voltage $U_H$ occurring at the output of the Hall generator 5, this being evidenced by the temperature coefficients $\alpha$ and $\beta$ applying to the Hall voltage $U_H$ and to the path resistance $R_H$ respectively, as represented by the diagram in FIG. 1. This compensation is improved with an increase in the resistance value of the feedback resistor *R* relative to the path resistance $R_H$. It has been found favorable to apply a resistance ratio R:R—hd H between 100 and 1,000.

Figure 3:
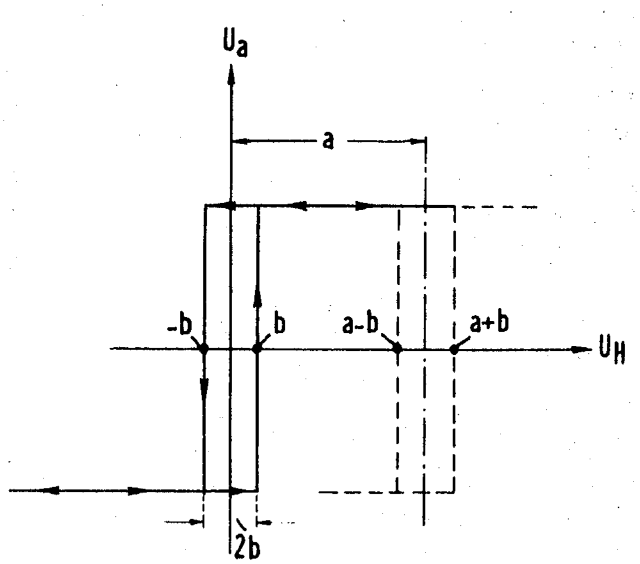
FIG. 3 is an explanatory graph relating to the switching operation of a device according to FIG. 2.

For some uses it is desirable to vary the trigger limits of the amplifying device according to FIG. 2 in such a sense that the switching hysteresis represented in FIG. 3 will be shifted to the position shown by broken lines, the vertical axis of symmetry being displaced by the amount "*a*" *in parallel relation to the ordinate axis. For this purpose, the contact bridge (or jumper) shown in FIG. 2 between the terminals 11 and 12 can be removed and be connected with the terminals 13 and 14 (or replaced by corresponding jumpers), as shown by broken lines. For this changed setting, a resistor 15 is inserted into the input circuit of the differential amplifier 7, and this resistor 15 is connected in series with the variable resistor 16 to form a voltage divider between the terminals 1 and 4. By giving the resistors 9 and 10 a sufficiently high-ohmic magnitude, a constant current in the control circuit extending through the terminals 3 and 4 can be reliably secured. Under this condition of a constant current through the Hall probe 5, the voltage drop occurring at the resistor 15 constitutes an additional threshold in the input circuit of the differential amplifier 7, this threshold being dependent upon the path resistance* $R_S/2$ which varies with temperature. The threshold corresponds to the displacement distance *a* in the diagram of FIG. 3 and varies under the effect of temperature in the same manner as the Hall voltage itself, so that in this case there also occurs an automatic compensation of temperature with respect to the threshold *a*. For example, when the Hall voltage decreases on account of an increase in temperature, the threshold *a* also decreases so that the amplifying device will remain independent of temperature and will respond at the same magnetic flux condition as prior to the temperature increase. For suppressing the effect of the Hall-voltage side path resistance $R_H$, the resistor 5 is preferably given a resistance at least 10 times as high as the series-connected path resistance $R_H/2$. The modification of the embodiment according to FIG. 2 last described thus is suitable as a limit-value sensor and is applicable, for example, for supervision of magnetic flux in electrical machines or in particle accelerators.

The embodiment illustrated in FIG. 4 is intended as a continuously operable Hall-voltage amplifier suitable, for example, for flux measuring. The difference from the flip-flop amplifying device according to FIG. 2 resides essentially in the fact that the resistor R is connected in the sense of a negative feedback, namely between the positive output terminal 8 of the amplifier 7 and the negative input terminal of the amplifier 7 as well as with the corresponding Hall-voltage terminal 4 of the Hall probe 5. Thus, the amplifying gain is determined in known manner by the negative-feedback resistance of resistor R conjointly with the input impedance which in this case is constituted by the internal resistance of the Hall probe. In other respects the device shown in FIG. 4 corresponds essentially to that of FIG. 2. More particularly, the device is equipped with two high-ohmic and equal-symmetrizing resistors 9 and 10 so that an impressed constant current will flow between the current-supply terminals 3 and 4 through the Hall plate 5. Referring to the substitute circuit diagram shown in FIG. 2 for the internal constitution of the Hall plate 5 and assuming a high no-load amplification gain of the differential amplifier 7 as well as under the assumption that $(R_H/2)/R \ll 1$, there results for the output $U_a$ of the amplifier the equation $U_a = 2R/\alpha R_H^{+} \cdot \beta U_H^{+}$.

The first term on the right side of this equation is to be looked upon as the so-called voltage amplification which exhibits virtually the inversely proportional temperature dependence as the Hall voltage impressed upon the differential amplifier. Consequently, in this case, too, the output voltage of the differential amplifier 7 is substantially unaffected by changes in temperatures.

Upon a study of this disclosure it will be apparent to those skilled in the art that my invention permits of a variety of modifications and uses other than particularly illustrated and described herein, without departing from the essential features of the invention and within the scope of the claims annexed hereto.

I claim:

1. A Hall-effect amplifying device comprising a Hall generator having Hall-voltage output electrodes, an electronic differential amplifier having two input terminals connected to said Hall-voltage electrodes to receive the Hall-generator output voltage and having an output for amplified voltage, and a feedback resistor connected between the output of said amplifier and one of the input terminals of said amplifier, said one of said input terminals being connected directly to a Hall-voltage output electrode of the Hall generator, and said feedback resistor means having a resistance at least two orders of magnitude higher than the internal resistance between said Hall-voltage output electrodes of said Hall generator.

2. A Hall-effect amplifying device comprising a Hall generator having Hall-voltage output electrodes, an electronic solid-state DC differential amplifier of high-ohmic input resistance in an order of magnitude of at least $10^6$ ohm and high open-loop voltage gain in the order of magnitude of $10^4$ said high-gain DC amplifier having two input terminals connected to said Hall-voltage electrodes to receive the Hall generator output voltage and having an output for amplified voltage, and a feedback resistor connected between the output of said amplifier and one of the input terminals of said amplifier, said one of said input terminals being connected directly to a Hall-voltage output electrode of the Hall generator.

3. In a Hall-effect amplifying device according to claim 1, suitable for use as a magnetic proximity sensor, said feedback resistor means forming a supercritical positive feedback relative to said amplifier.

4. In a Hall-effect amplifying device according to claim 1, said amplifier input leads being poled relative to said resistor means for positive feedback, said Hall generator having two current-supply terminals, and a voltage divider connected between one of said supply terminals and the other Hall-voltage output electrode, said voltage divider having a portion serially interposed between said other output electrode and said other amplifier input terminal.

5. In a Hall-effect amplifying device according to claim 4, said voltage-divider portion having a resistance at least one order of magnitude larger than the Hall-generator internal resistance with which said divider portion is series connected.

6. In a Hall-effect amplifying device according to claim 4, said voltage divider comprising a resistor of variable resistance.

7. In a Hall-effect amplifying device according to claim 1, said amplifier input terminals being poled relative to said resistor means for negative-feedback connection of said resistor means relative to said amplifier.